US012050291B2

(12) United States Patent
Jarrell et al.

(10) Patent No.: US 12,050,291 B2
(45) Date of Patent: Jul. 30, 2024

(54) INDIRECT CONVERSION NUCLEAR BATTERY USING TRANSPARENT SCINTILLATOR MATERIAL

(71) Applicant: Lawrence Livermore National Security, LLC, Livermore, CA (US)

(72) Inventors: Joshua Jarrell, Livermore, CA (US); Nerine Cherepy, Piedmont, CA (US); John Winter Murphy, Mountain House, CA (US); Rebecca J. Nikolic, Oakland, CA (US); Erik Lars Swanberg, Jr., Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 62 days.

(21) Appl. No.: 17/863,164

(22) Filed: Jul. 12, 2022

(65) Prior Publication Data
US 2022/0350039 A1    Nov. 3, 2022

Related U.S. Application Data

(63) Continuation of application No. 17/073,015, filed on Oct. 16, 2020, now Pat. No. 11,415,713.

(51) Int. Cl.
*G01T 1/20*    (2006.01)
*G01T 1/202*    (2006.01)
*H01L 31/115*    (2006.01)

(52) U.S. Cl.
CPC .......... *G01T 1/2023* (2013.01); *G01T 1/2002* (2013.01); *H01L 31/115* (2013.01)

(58) Field of Classification Search
CPC .... G01T 1/2023; G01T 1/2002; H01L 31/115
See application file for complete search history.

(56) References Cited

U.S. PATENT DOCUMENTS

| | | | |
|---|---|---|---|
| 8,937,360 B1* | 1/2015 | Moosman | G21H 1/06 |
| | | | 257/E21.465 |
| 9,018,721 B1 | 4/2015 | Moosman et al. | |
| 9,224,901 B1 | 12/2015 | Squillante et al. | |
| 9,837,564 B1 | 12/2017 | Sykora et al. | |
| 10,665,359 B2 | 5/2020 | Nino et al. | |
| 11,415,713 B2 | 8/2022 | Jarrell et al. | |
| 2010/0294939 A1 | 11/2010 | Kuntz et al. | |
| 2011/0150735 A1 | 6/2011 | Roberts et al. | |
| 2011/0241600 A1 | 10/2011 | Kazem | |
| 2016/0217878 A1* | 7/2016 | Nino | H02S 40/38 |
| 2017/0355905 A1 | 12/2017 | Bourret-Courchesne et al. | |
| 2018/0108446 A1* | 4/2018 | Cabauy | H01L 31/0304 |

(Continued)

OTHER PUBLICATIONS

Wikipedia, "Photodiode," Wikipedia, 2020, 9 pages, retrieved from https://en.wikipedia.org/wiki/Photodiode.

(Continued)

*Primary Examiner* — Hugh Maupin
(74) *Attorney, Agent, or Firm* — Zilka-Kotab, P.C.

(57) ABSTRACT

A product includes a transparent scintillator material, a beta emitter material having an end-point energy of greater than 225 kiloelectron volts (keV), and a photovoltaic portion configured to convert light emitted by the scintillator material to electricity. A thickness the scintillator material is sufficient to protect the photovoltaic portion from significant radiation damage.

20 Claims, 8 Drawing Sheets

(56) References Cited

U.S. PATENT DOCUMENTS

2021/0328086 A1* 10/2021 Hubbard .............. C09K 11/025
2022/0120920 A1 4/2022 Jarrell et al.

OTHER PUBLICATIONS

Wikipedia, "Photovoltaics," Wikipedia, 2020, 28 pages, retrieved from https://en.wikipedia.org/wiki/Photovoltaics.

CCOHS, "Radiation—Quantities and Units of Ionizing Radiation," CCOHS, OSH Answers Fact Sheets, 2020, 14 pages, retrieved from https://www.ccohs.ca/oshanswers/phys_agents/ionizing.html.

Wikipedia, "Rad (unit)," Wikipedia, 2020, 5 pages, retrieved from https://en.wikipedia.org/wiki/Rad_(unit)#:~:text=dose%20in%20rad.-,Material%20effects,under%20the%20effect%20of%20radiation.

Slideshare, "Luminous transmittance & Haze, Clarity and Photo elasticity," Slideshare, Jun. 3, 2014, 18 pages, retrieved from https://www.slideshare.net/AttittudeBlogger/amal-ppt#:~:text=LUMINOUS%20TRANSMITTANCE%20%26%20HAZE%20%EF%81%B5%20Luminous,light%20passes%20through%20a%20sample.

Bailey et al., "Photovoltaic development for alpha voltaic batteries," IEEE, 2005, pp. 106-109.

Cherepy et al., "Development of Transparent Ceramic Ce-Doped Gadolinium Garnet Gamma Spectrometers," IEEE Transactions on Nuclear Science, vol. 60, No. 03, Jun. 2013, pp. 2330-2335.

Lei et al., "Demonstration and aging test of a radiation resistant strontium-90 betavoltaic mechanism," Applied Physics Letters, vol. 116, Apr. 2020, 5 pages.

Olsen et al., "Betavoltaic power sources," Physics Today, vol. 65, 2012, 5 pages.

Woody et al., "Radiation Damage in Undoped CsI and CsI(T1)," IEEE Transactions on Nuclear Science, vol. 39, No. 4, 1992, pp. 524-531.

Jarrell et al., U.S. Appl. No. 17/073,015, filed Oct. 16, 2020.

Non-Final Office Action from U.S. Appl. No. 17/073,015, dated Jun. 24, 2021.

Non-Final Office Action from U.S. Appl. No. 17/073,015, dated Nov. 29, 2021.

Notice of Allowance from U.S. Appl. No. 17/073,015, dated Apr. 7, 2022.

* cited by examiner

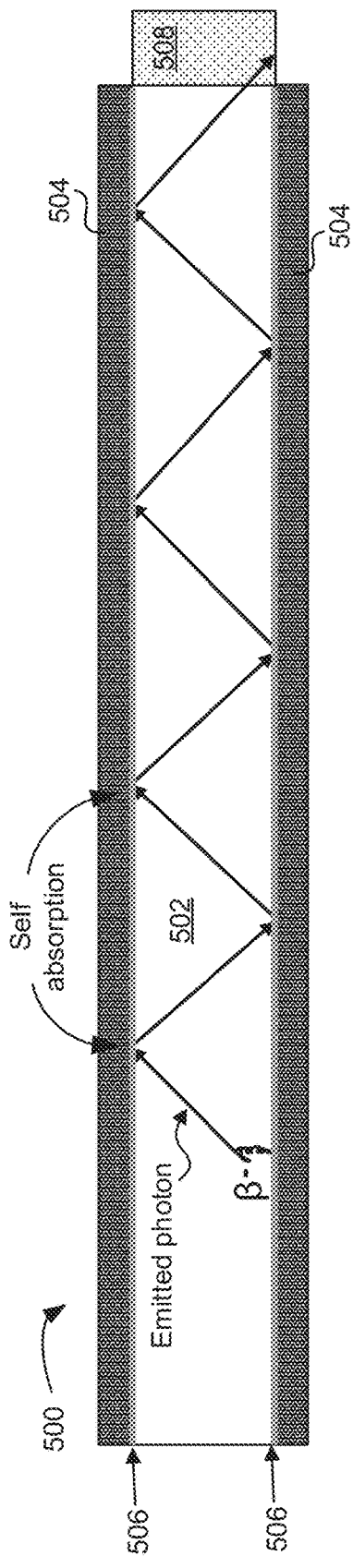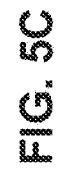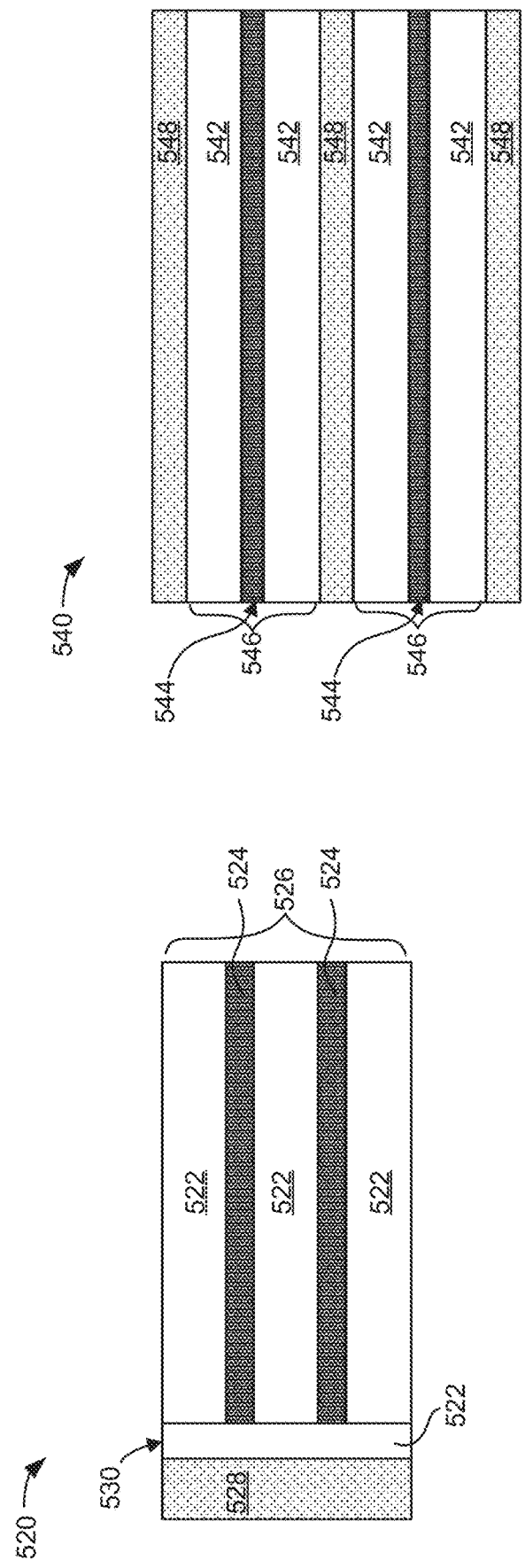
FIG. 5A
FIG. 5B
FIG. 5C

600 ⤵

Form a product that includes a transparent scintillator material, a beta emitter having an energy of greater than 225 kiloelectron volts (keV), and a photovoltaic portion configured to convert light emitted by the scintillator material to electricity — 602

FIG. 6

INDIRECT CONVERSION NUCLEAR BATTERY USING TRANSPARENT SCINTILLATOR MATERIAL

RELATED APPLICATIONS

This application is a Continuation of U.S. patent application Ser. No. 17/073,015 filed Oct. 16, 2020, which is herein incorporated by reference.

This invention was made with Government support under Contract No. DE-AC52-07NA27344 awarded by the United States Department of Energy. The Government has certain rights in the invention.

FIELD OF THE INVENTION

The present invention relates to nuclear batteries, and more particularly, this invention relates nuclear batteries using transparent scintillator material and methods of making same.

BACKGROUND

Development of a long-lived high power density radioisotope battery has relied on incorporating either larger quantities of low energy emitting isotopes such as tritium (H-3) which limits the geometry of the battery or smaller quantities of higher energy emitting isotopes such as strontium-90 (Sr-90) and its daughter product yttrium-90 (Y-90). Some conventional radiovoltaic devices directly convert tritium beta decay energy to electric current by using thin (~200 nanometer thick) semiconductor layers but have limited power densities of less than 20 $\mu W/cm^3$. Other commercial devices employ higher energy beta emitting isotopes such as promethium-147 (Pm-147) but have only demonstrated power densities of approximately 25 $\mu W/cm^3$. Moreover, Pm-147 is scarce, does not occur naturally and requires complex chemical separation processes from spent nuclear fuel.

Some studies have shown that using alpha or high energy beta sources can generate greater power density compared to lower energy beta sources, e.g., beta sources such as tritium, Ni-63, etc., that generate much lower power densities. For example, as shown in the schematic diagram of a radiovoltaic battery 100 in FIG. 1A, using a direct conversion process, radiation energy (e.g., alpha ($\alpha$) particles, beta ($\beta$) emission particles, etc.) may be converted to an electric current (I) through a multi-step process using semiconductor junctions (P-i-N). However, these conventional radiovoltaic structures include semiconductor materials and high energy particles, e.g., alpha particles, high energy beta emissions, etc. tend to degrade semiconductor-based radiovoltaics rapidly through defect production. Thus, conventional radiovoltaic structures are restricted to being best suited for low power electrical applications.

Recent contemplated approaches have suggested incorporating radiation hard scintillating material to convert radiation to photons. As shown in the process as illustrated in the schematic drawing 120 in FIG. 1B, a scintillator 122 converts kinetic energy from ionizing radiation 124 to photons 126 through excitation and emission. Early attempts to create a battery that functions to convert radiation to electrical energy have been unable to produce a viable result.

In some reports, combining single crystal inorganic scintillators, fluorescing powders, etc. with low energy beta emitting radioisotopes has resulted in low power densities below 1 $mW/cm^3$. For example, in conventional systems to generate light, lower energy beta emission particles (e.g., tritium, H-3) have been combined with scintillator material (e.g., Exit signs) and demonstrate minimal degradation. However, in these products the low energy generated by tritium decay also generates limited power densities. Moreover, in similar scintillator systems that replace the tritium with higher energy particles such as x-rays, gamma particles, high energy beta emission particles, etc. the scintillator material used in these systems demonstrate significant degradation (e.g., point defects, etc.) during irradiation with the higher energy particles.

Moreover, exposure to high energy beta emitting radioisotopes has resulted in radiation-induced degradation and eventual failure of scintillating material thereby limiting the duration of power generation and power density in these systems. For example, a device coupling scintillating material SrI and radioisotope Sr-90 suffered from radiation-induced degradation and eventual failure of the SrI, thereby enabling only a very limited power density.

In addition, some scintillator materials may be damaged more rapidly during extended exposure to alpha particles compared to extended exposure to high energy beta emission particles. For some scintillator materials, irradiation over extended periods of time results in increased degradation of the material and progressively less light production. For example, a single crystal inorganic scintillator material, e.g., CsI, is bright, but is unstable in air, easily damaged by radiation, and sensitive to temperature.

It would be desirable to develop long-lived radioisotope batteries capable of high power density for long periods of operation as an enabling technology to develop electrically powered systems in remote locations or long-term applications.

SUMMARY

In one embodiment, a product includes a transparent scintillator material, a beta emitter material having an end-point energy of greater than 225 kiloelectron volts (keV), and a photovoltaic portion configured to convert light emitted by the scintillator material to electricity. A thickness the scintillator material is sufficient to protect the photovoltaic portion from significant radiation damage.

In another embodiment, a product includes a transparent scintillator material, a beta emitter material having an end-point energy of greater than 225 kiloelectron volts (keV), and a photovoltaic portion configured to convert light emitted by the scintillator material to electricity. The scintillator material is present in two layers, and the layers of scintillator material are positioned between the beta emitter material and the photovoltaic portion. The beta emitter material and sections of the scintillator material are present in alternating portions in the space between the layers of the scintillator material.

In yet another embodiment, a product includes a transparent scintillator material, a beta emitter material having an end-point energy of greater than 225 kiloelectron volts (keV), a photovoltaic portion configured to convert light emitted by the scintillator material to electricity, and transparent shielding layers between the photovoltaic portion and the beta emitter material, wherein a thickness of each shielding layer is sufficient to protect the photovoltaic portion from more than negligible radiation damage.

Other aspects and implementations of the presently described inventive concepts will become apparent from the following detailed description, which, when taken in conjunction with the drawings, illustrate by way of example the principles of the invention.

BRIEF DESCRIPTION OF DRAWINGS

FIG. 5A is a schematic diagram of a device including GYGAG(Ce) scintillator material, according to one contemplated approach.

FIGS. 5B-5C each depict a schematic diagram of a stacked diode design of a device, according to some contemplated approaches.

FIG. 6 is a flow chart of a method, according to one embodiment.

FIG. 8A is a plot showing the radiation hardness of a GYGAG(Ce) scintillator in response to beta irradiation.

FIG. 8B is a plot showing the effect of alpha irradiation on two sides of a GYGAG(Ce) scintillator.

DETAILED DESCRIPTION

Figure 1A:
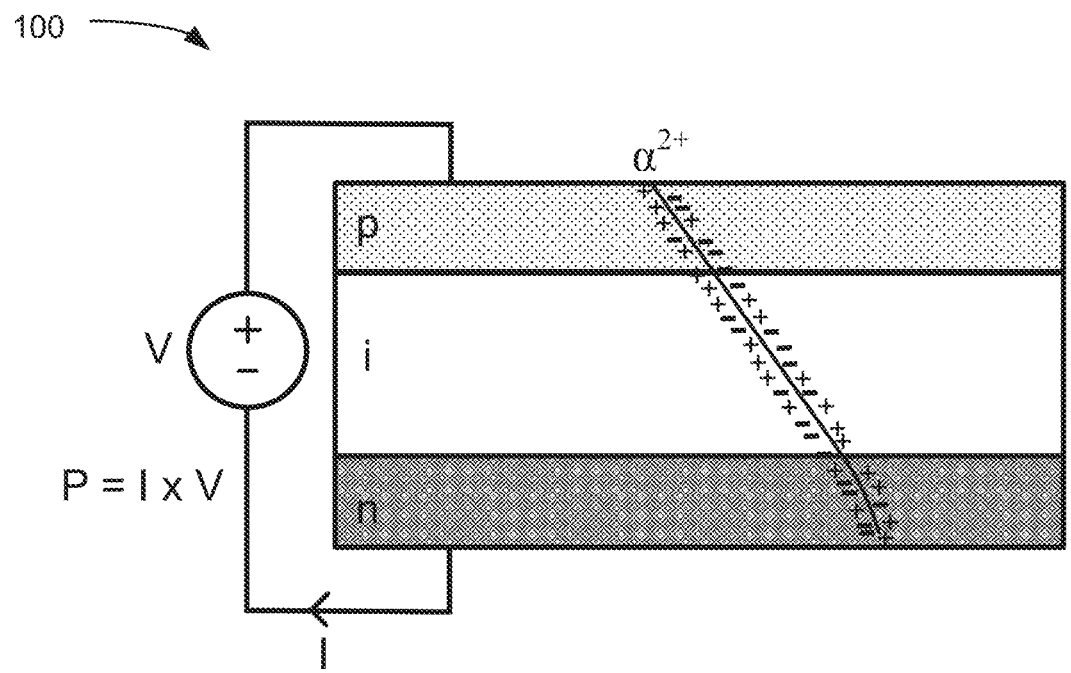
FIG. 1A is a schematic diagram of a conventional radio-voltaic battery.
Figure 1B:
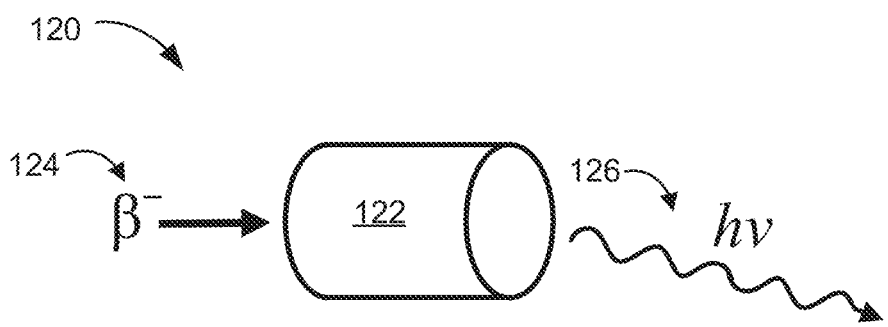
FIG. 1B schematic drawing of the conversion of ionizing radiation to a photon via a scintillator.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

As also used herein, the term "about" denotes an interval of accuracy that ensures the technical effect of the feature in question. In various approaches, the term "about" when combined with a value, refers to plus and minus 10% of the reference value. For example, a thickness of about 10 nm refers to a thickness of 10 nm±1 nm, a temperature of about 50° C. refers to a temperature of 50° C.±5° C., etc.

For the purposes of this application, room temperature is defined as in a range of about 20° C. to about 25° C.

For the purposes of this application, radiation resistance is measured in terms of resistance to an absorbed dose in units of rad, such that one rad is equivalent to 100 erg/g or 0.01 Gray (Gy). One megarad (Mrad) is equivalent to one million rads. One gigarad (Grad) is equivalent to 1000 Mrads.

The following description defines a material being transparent as allowing light to pass through so that objects behind may be distinctly seen. Transparency of a material is defined as having a luminous transmittance value of at least 85% of a given wavelength or range of wavelengths of light passing through the material. This corresponds to optical scatter of typically less than 20% per centimeter (cm) of material. Optical scatter is measured via scatterometry at the scintillation wavelength which involves passing a laser beam through a sample held in an integrating sphere; and the resulting scattered photons into the sphere are detected as optical scatter. In some cases, a degree of transparency may also be defined as not opaque, optically clear, etc. These are by way of example only and are not meant to be limiting in any way.

Unless expressly defined otherwise herein, each component listed in a particular approach may be present in an effective amount. An effective amount of a component means that enough of the component is present to result in a discernable change in a target characteristic of the final product in which the component is present, and preferably results in a change of the characteristic to within a desired range. One skilled in the art, now armed with the teachings herein, would be able to readily determine an effective amount of a particular component without having to resort to undue experimentation.

The description herein is presented to enable any person skilled in the art to make and use the invention and is provided in the context of particular applications of the invention and their requirements. Various modifications to the disclosed embodiments will be readily apparent to those skilled in the art upon reading the present disclosure, including combining features from various embodiment to create additional and/or alternative embodiments thereof.

Moreover, the general principles defined herein may be applied to other embodiments and applications without departing from the spirit and scope of the present invention. Thus, the present invention is not intended to be limited to the embodiments shown but is to be accorded the widest scope consistent with the principles and features disclosed herein.

The following description discloses several preferred inventive concepts of an indirect conversion nuclear battery using transparent scintillator material and/or related systems and methods.

In one general embodiment, a product includes a transparent scintillator material, a beta emitter material having an end-point energy of greater than 225 kiloelectron volts (keV), and a photovoltaic portion configured to convert light emitted by the scintillator material to electricity.

In another general embodiment, a method includes forming a product having a transparent scintillator material, a beta emitter material having an energy of greater than 225 kiloelectronvolts (keV), and a photovoltaic portion configured to convert light emitted by the scintillator material to electricity.

A list of abbreviations and acronyms used in the description is provided below.
2D two-dimensional
3D three-dimensional
C Celsius
CsI cesium iodide
cm centimeter
Grad gigarad
GYGAG gadolinium yttrium gallium aluminum garnet
H-3 tritium
InGaP Indium gallium phosphide
keV kiloelectron volts
Kr-85 krypton-85
LuAG lutetium aluminum garnet
LYSO lutetium-yttrium oxyorthosilicate
MeV megaelectron volt
μm micron
mW milliwatt
μW microwatt
mm millimeter
Mrad megarad
nm nanometer
Pm-147 promethium-147
RT room temperature
Si silicon
Sr-90 strontium-90
SrI strontium iodide
Tl-204 thallium-204
Y-90 yttrium-90

Various embodiments described herein operate using the principle of converting the kinetic energy from a radioisotope decay particle via an indirect step into photons and then converting those photons into electricity. As described herein, a device includes a radiation source providing ionizing energy that enters a scintillator material, the layer of the scintillator material in turn converts the ionizing energy to photons comprising light energy, and an adjacent photovoltaic portion coupled to the scintillator material in turn converts the light energy carried by the photons to electrical energy carried by electrons, e.g., a current. In one approach, the device as described herein is a battery.

According to one embodiment, a method includes constructing a long-life electrical power generation device powered by the decay of a radioisotope using a radiation-hard scintillator and a photovoltaic portion. In one approach, the device includes a transparent polycrystalline ceramic garnet scintillator activated by a rare earth element in physical contact with a long-lived beta emitter, e.g., such as thallium-204 (Tl-204), Sr-90, etc., to generate photons. The system-generated photons are converted to electricity through a photoelectric effect by way of photovoltaics adjacent the scintillator and radioisotope in a layered structure.

As described herein, according to various embodiments, a radiovoltaic device includes scintillating material that tends to be more radiation hard (resistant to degradation due to exposure to ionizing radiation) than semiconducting materials, and that efficiently converts damaging radiation into photons. In one approach, a radiovoltaic device preferably maximizes the optical transport of a beta emission with highest selection efficiency.

According to one embodiment, a product may be a two-dimensional (2D) structure, for example, a planar structure. The product includes a transparent scintillator material, a beta emitter material having an end-point energy of greater than 225 kiloelectron volts (keV), and a photovoltaic portion configured to convert light emitted by the scintillator material to electricity. End-point energy is defined as the maximum energy which can be imparted to the beta particle as a result of the kinematics of the 3 body system of beta decay for a given radioisotope decay energy. A transparent material is defined as having a transparency and dimensions such that a luminous transmittance value of at least 85% of the light created within the scintillator material passes out of the scintillator material.

Figure 2:
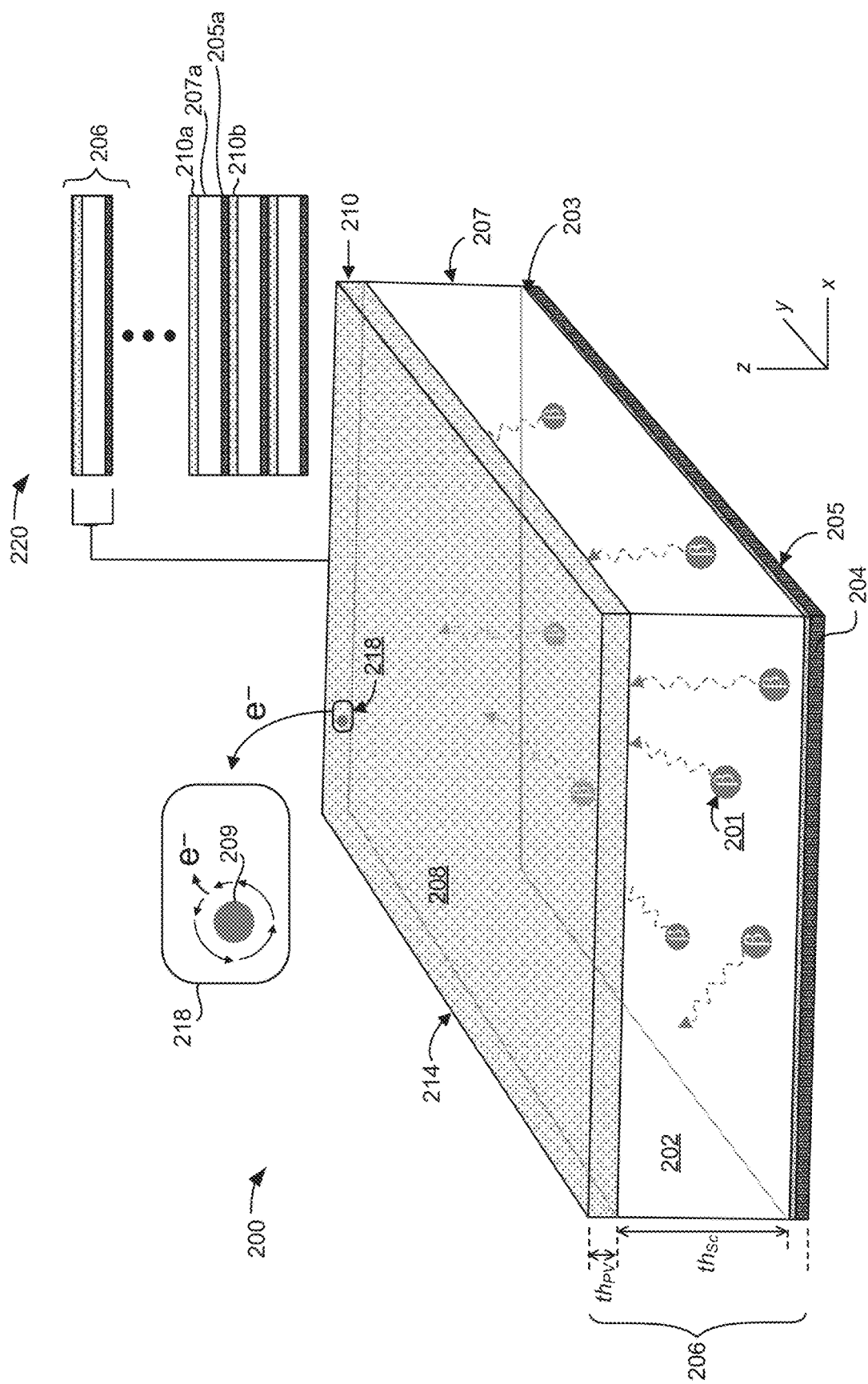
FIG. 2 is a schematic diagram of a product having a transparent scintillator material, beta emitter material, and a photovoltaic portion, according to one embodiment.

FIG. 2 depicts a product 200, in accordance with one embodiment. As an option, the present product 200 may be implemented in conjunction with features from any other embodiment listed herein, such as those described with reference to the other FIGS. Of course, however, such product 200 and others presented herein may be used in various applications and/or in permutations which may or may not be specifically described in the illustrative embodiments listed herein. Further, the product 200 presented herein may be used in any desired environment.

As illustrated in FIG. 2, a product 200 has a single stack 206 of layers that include a layer 207 of transparent scintillator material 202 (e.g., a light generation cell), a layer 205 of beta emitter material 204, and a photovoltaic portion 214 configured to convert light emitted by the scintillator material 202 to electricity e⁻. The photovoltaic portion may be a single power producing unit.

A beta (P) emission 201 from the beta emitter material 204 passes into the scintillator material 202 where the beta emission 201 is converted to a photon 209. The photovoltaic portion 214 is configured to convert the photon 209 emitted by the scintillator material 202 to electricity e⁻, e.g., electrical current. as illustrated in the simple schematic drawing of a magnified view 218 of a photovoltaic effect.

In addition, the stack 206 of layers may include a reflective layer 203 on the upper surface of the layer 205 of beta emitter material 204. In some approaches, a reflective layer may be included on at least one of the sides of the layer of scintillator material in a z-direction of the thickness of the layer in order to prevent light from escaping from the sides of the layer of scintillator material.

As a radiation source, the beta emitter material 204 may include high energy beta emission particles. In various approaches the beta emitter material has an energy above a level that typically damages most semiconductor materials. In some approaches, the beta emitter material has an energy (e.g., radiation energy) of greater than 100 keV. In preferred approaches, the beta emitter material has an energy of greater than 225 keV. In some approaches, the beta emitter material may have an energy less than 200 keV.

In some approaches, the beta emitter material is preferably metallic having a maximum density. In one approach, the beta emitter material may include thallium-204 (Tl-204, Tl metal), strontium-90 (Sr-90), krypton-85 (Kr-85), argon-39 (Ar-39), Ar-42, yttrium-90 (Y-90), cadmium-113m (Cd-113m), etc. In a preferred approach, Tl-204 having a maximum radiation of 750 keV may be an optimal beta emitter material. In some approaches, beta emitter material may have an average radiation energy of less than about 1 MeV, for example, strontium-90 (Sr-90). In some approaches, the beta emitter material may include a combination of beta emitter materials, e.g., Tl-204 and Sr-90. Tl-204 and Pm-147, etc.

In various approaches, the amount of beta emitter material may be inversely coordinated to the desired total power density of the layer of beta emitter material. For example, a thicker layer of beta emitter material promotes increased self-absorption, thereby in turn decreasing efficiency of extracting energy of the decay for transforming into photons. In some approaches having volume constrained designs in which the radioisotope material may be limited to a maximum surface area, the thickness of the layer of radioisotope material may allow higher amounts of radioisotope thereby possibly decreasing efficiency without affecting light output. The efficiency of collected energy from the beta emitter may decrease with thicker layers, but the total energy collected tends not to decrease, and thus light output may be unaffected. Thus, in some approaches, as the amount of beta emitter material increases, light output production efficiency may decrease.

According to one embodiment, a system incorporates recently developed polycrystalline ceramic garnet scintillators having improved radiation hardness. The brightness of the polycrystalline ceramic garnet scintillators is preferably comparable to that of single crystal inorganic scintillators.

The scintillator material 202 is preferably a radiation hard scintillator material. The radiation hard scintillator material may be characterized as not exhibiting a significant (greater than 10%) degradation of light output under continuous exposure to radiation energy at 1 megaelectron volt (MeV) to a dose of at least 1 gigarad (Grad) over the duration of one year. In one approach, the continuous exposure to radiation may include exposure to 1 MeV to a cumulative dose of greater than 1 gigarad over a duration of one year. In one approach, the scintillator material may exhibit a light output of greater than 30,000 photons per megaelectron volt (MeV).

In one approach, the scintillator material may be in the form of a ceramic. In preferred approaches, the scintillator material is in the form of a transparent ceramic. In exemplary approaches, the scintillator material includes a transparent ceramic. In preferred approaches, a ceramic scintillator material has improved radiation hardness over single crystal scintillator material. In another approach, the scintillator material may be in the form of a single crystal material. The single crystal material may be formed from sintered particles, melt grown, ball milling of the materials.

In one approach, the scintillator material may be in the form of a powder. Illustrative examples of powders include ZnS:Cu, ZnS:Ag, etc.

In some approaches, the scintillator material 202 may include an inorganic scintillator material. In a preferred approach, the inorganic scintillator material is polycrystalline ceramic, e.g., lutetium aluminum garnet (LuAG), lutetium-yttrium oxyorthosilicate (LYSO), gadolinium yttrium gallium aluminum garnet (GYGAG), etc. Polycrystalline ceramics tend to be robust, radiation-hard, and low-cost. In particular, gadolinium yttrium gallium aluminum garnet (GYGAG) scintillator material offers several desirable properties: an emission spectrum centered at 2.2 eV, well matched to photovoltaic conversion, material that is machinable, a solid-state material, etc.

In one approach, at least some of the scintillator material includes an activator such as cerium (Ce), europium (Eu), samarium II (SmII), copper (Cu), silver (Ag), thallium (Tl), etc. Activators may be used as dopants of the scintillator material in an effective amount for promoting high light yields. For example, in an exemplary approach, the scintillator material includes a cerium-activated gadolinium yttrium gallium aluminum garnet (GYGAG(Ce)). A scintillator material doped with cerium may provide faster luminescence thereby preventing a dissipation of energy to undesirable reactions. A faster decay time may promote a more radiation hard material. In preferred approaches, rare earth-based scintillators activated with cerium in particular demonstrate improved radiation hardness over alternative scintillators.

Cesium-doped GYGAG, (GYGAG(Ce)) ceramic scintillator is a bright, radiation-hard scintillator. In one example, GYGAG(Ce) is a transparent ceramic scintillator. A typical formula for GYGAG(Ce) is $Gd_{1.5}Y_{1.5}Ga_{2.2}Al_{2.8}O_{12}(Ce)$. The density of a GYGAG(Ce) scintillator material is 5.8 g/cm$^3$. In one approach, the incident radiation-to-photon conversion efficiency of a GYGAG(Ce) material for an emission photon exhibiting about 2.2 eV may be in a range of about 8 to 11% (for the spectral range of 450 nm to 700 nm, as shown in FIG. 7B, Experiments section).

In one approach, the scintillator material demonstrates radiation hardness in response to beta irradiation. In recent approaches, a radiation hardness of the material may be on the order of 10s to 100s of gigarad (Grad). In one exemplary approach, a device having a transparent ceramic GYGAG (Ce) scintillator material shows no degradation for the full lifetime of the device. For example, irradiation of a transparent ceramic GYGAG(Ce) scintillator material with 1 MeV electrons to a fluence of 1e17/cm$^2$ and dose of approximately 2.9 Grad and with 750 keV electrons to a fluence of 1e19/cm$^2$ and a dose of up to 310 Grad demonstrates essentially no degradation of radioluminescence. Moreover, essentially no difference in scintillation efficiency may be determined between two opposite sides of a scintillator sample, following irradiation with 1 MeV electrons that do not penetrate the full thickness of the scintillator (as shown in FIG. 8A, Experiments section). Without wishing to be bound by any theory, it is believed that a higher irradiation dose may allow for more accurate extrapolation to an expected battery outcome.

In some approaches, alpha particle irradiation of GYGAG (Ce) scintillator material may not be efficient for power generation. Using a fraction of the number of particles as may be used in beta irradiation of a similar sample, the emission maxima may demonstrate greater than 90% degradation of light yield compared to the non-irradiated side of the scintillator sample (as shown in FIG. 8B, Experiments section).

In one approach, the scintillator material may include single crystal growth material. However, in some instances, comparing the GYGAG(Ce) scintillator to a single crystal scintillator, e.g., CsI, with similar brightness, the CsI single crystal degrades by 30% following irradiation with 1 krad.

In some approaches, scintillator material may include inorganic oxide scintillator materials. In one approach, oxide scintillator materials have typically been labeled as emitting blue light and thus not be well-matched for photodetectors. In one approach, a peak wavelength of emission may be in the green-yellow light which is typically better suited for photovoltaic conversion. Conventional semiconductors for photovoltaics have bandgap energies below the energy of blue light and are therefore inefficient at converting the light into current. Green luminescence is advantageous for detection and conversion of energy allowing for the use of a more efficient silicon converter. In particular, zinc sulfide-type phosphors are generally understood to be durable for long periods of time during cathode ray excitation (e.g., black and white televisions). However, oxide scintillators tend to be single crystal and, thus, are limited by geometry of the scintillator.

As illustrated in FIG. 2, in a preferred approach, a device includes thin layers 207 of a scintillator material 202 having a high Z scintillation property (e.g., a high effective atomic number) for providing an effective radiation shield (e.g., high stopping power) and for attenuating x-rays. Thus, in preferred approaches, a minimal thickness $th_{Sc}$ of scintillation material 202 separates the beta emitter material 204 and photovoltaic portion 214.

In some approaches, the thickness $th_{Sc}$ of the scintillator material may be determined by several properties of the device. For instance, at least one of the following properties may be considered for determining the thickness $th_{Sc}$ of the scintillator material: radiation harness of the photovoltaic material such that damage to the photovoltaic by the beta emissions is minimized, a total amount of beta emitter material included in the device, the effective atomic number (Z) and physical density of the scintillator material for optimal power output, etc.

In one approach, an optimal thickness $th_{Sc}$ of the scintillator material may be based on power density of the battery, and the density and atomic number of the scintillator material. For example, a thickness of the scintillator material may be relative to the range of the beta emission particle passing through the scintillator material, such that, 1 MeV beta emission that has a range of 200 µm, then a thickness of the scintillator may preferably be 200 µm to fully attenuate the energy of the beta emission particle. These values are by way of example only and not meant to be limiting in any way.

In one approach, the thickness $th_{Sc}$ of the layer 207 of scintillator material 202 may be in a range of about 150 µm to up to about 3 mm (3000 µm). In some approaches, the thickness $th_{Sc}$ of the layer 207 of scintillator material 202 may be tuned according to the radioisotope of the system. For example, in a system including Tl-204, the lower range of thickness may be appropriate, e.g., 150 µm to about 500 µm, whereas for a system including Sr-90, the upper range of thickness may be appropriate, e.g., within the mm range.

The photovoltaic portion 214 may be a single power producing unit that includes a layer 210 of photovoltaic material 208 above the layer 205 of beta emitter material 204 with the layer 207 of scintillator material 202 therebetween.

According to one embodiment, the photovoltaic portion 214 converts the photons 209 generated by the scintillator material 202 to electricity e–, e.g., electrical current. In any approach, the photovoltaic portion may be comprised of materials known in the art. In preferred approaches, the photovoltaic layer has an absorption spectrum well-matched to the emission spectrum of the scintillator material. The energy of the emission of the scintillator material is preferably equal to or greater than the band gap of the photovoltaic material to ensure the higher efficiency with the band gap light. For example, the energy needed to create electricity flow is preferably higher than, but nearly exactly, the band gap of the photovoltaic material and thus a wide band gap for the photovoltaic material may likely reduce power generation. The band gap of the photovoltaic material is preferably lower than, but nearly equal to, the energy of the photons that are emitted from the scintillator material.

In one approach, a photovoltaic layer includes a III-V semiconductor thin film photovoltaic material. For example, the photovoltaic portion of a preferred device includes a III-IV semiconductor material, such as Indium gallium phosphide (InGaP), that demonstrates higher radiation hardness and thus tolerates higher radiation dose compared to the material used in conventional photovoltaics.

In some approaches, the photovoltaic material includes a standard wide-band gap semiconductor material. For blue emission, photovoltaic material may include silicon carbide, gallium nitride, etc. In an exemplary approach, indium gallium phosphide (InGaP) provides a single junction III-V that matches a desired spectrum, e.g., approximately 1.9 eV bandgap. It is not preferable to have multiple junctions that limit current and decrease power. In contrast a multi-terminal junction may not limit current or decrease power.

Moreover, in some approaches, the photovoltaic layer includes a radiation hard photovoltaic material. Preferably, an exemplary photovoltaic material balances optimal brightness with radiation hardness. In one approach, a radiation hard photovoltaic material is preferred to minimize the distance between the radioisotope source (e.g., beta emitter material) and the photovoltaic portion. In one approach, a thickness $th_{PV}$ of the photovoltaic portion 214 may be in a range of about 1 µm to about 500 µm, preferably in a range of about 5 µm to about 20 µm. The range of thickness may be limited on the lower end by ability to produce a functioning photovoltaic, e.g., about 1 to 5 microns. The range of thickness may be limited on the upper end due to constraints on power density. A very thick (100's of microns) photovoltaic may likely reduce power density by occupying more volume without contributing more power.

In a preferred embodiment, each layer in the stack 206 of layers of the product 200 (e.g., a photovoltaic cell) has an optimal minimal thickness for maximum efficiency and power density. In one approach, a thinner layer of the photovoltaic layer 210, approximately 5 to 10 µm, may allow for higher power density.

In one approach, the photovoltaic material may include amorphous silicon. Amorphous material tends to have greater radiation hardness than the single or polycrystalline analog, however the electrical properties of amorphous silicon which influence charge collection efficiency tend to be inferior to the single crystal material, in terms of the minority carrier diffusion and minority carrier lifetime. Other photovoltaic materials may include: CIGS, GaP, CdTe, CdSe, black-Si, GaAs, CdS, ZnTe, AlP, InP, etc.

Figure 3A:
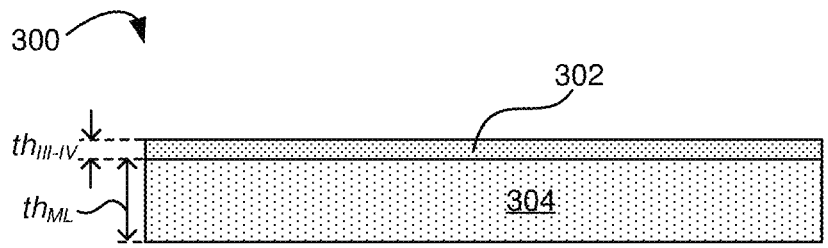
FIG. 3A is a schematic diagram of a photovoltaic device, according to one embodiment.

As illustrated in the schematic drawing of a photovoltaic device 300 in FIG. 3A, a thin layer 302 of a III-IV semiconductor material, e.g., InGaP, may be positioned adjacent a metal layer 304. In some approaches, the thickness $th_{ML}$ of the metal layer 304 may be greater than the thickness $th_{III-IV}$ of the thin layer 302 of III-IV semiconductor material. In preferred approaches, a ratio of the thickness $th_{III-IV}$ of the thin layer 302 to the thickness $th_{ML}$ of the metal layer 304 may be about 1:5. For example, a thickness $th_{III-IV}$ of the thin layer 302 of III-IV semiconductor (e.g., InGaP) may be about 1 µm and the thickness $th_{ML}$ of the metal layer 304 may be about 5 µm. Preferably, the metal layer 304 provides mechanical support as a backside metallization to the semiconductor material of the photovoltaic. In preferred approach, a minimum thickness of the photovoltaic device may be limited by the metal layer that functions as backside metallization. A minimum thickness of the metal layer 304 may be approximately 5 µm. In some cases, a backside metal contact having a thickness of less than 5 µm may result in insufficient mechanical support to maintain the structural integrity of the semiconductor layer, e.g., the semiconductor may crumble.

Figure 3B:
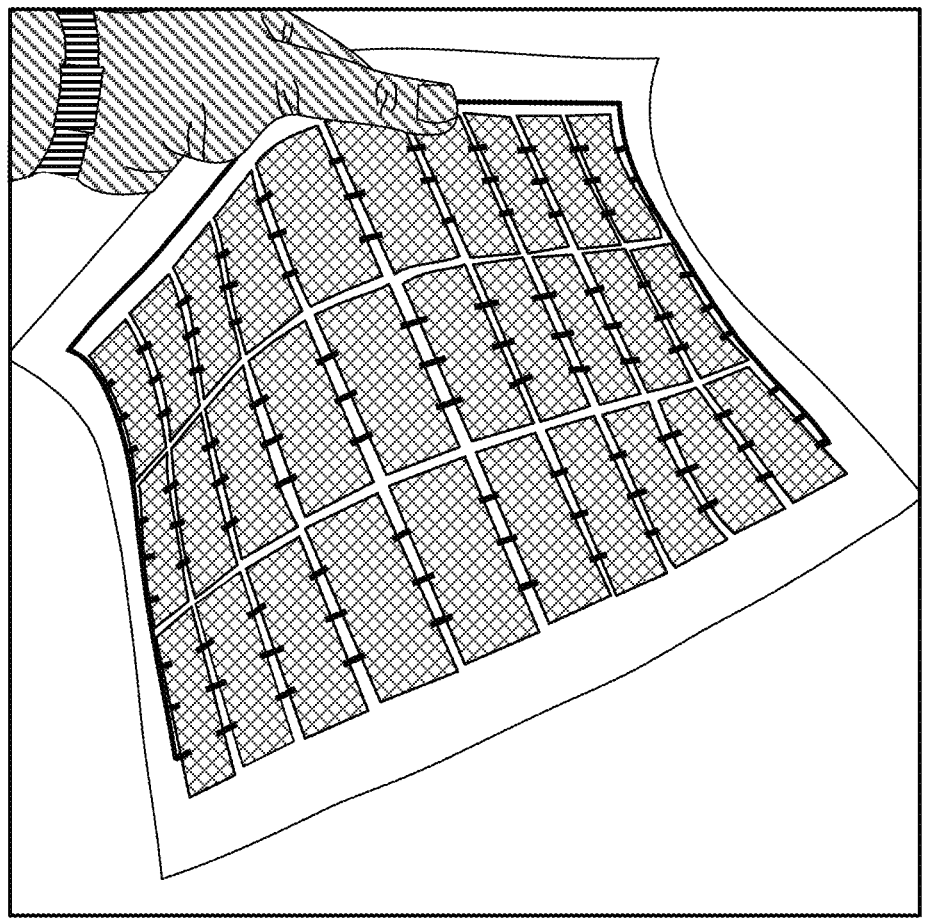
FIG. 3B is an image of a thin film photovoltaic device, according to one embodiment.

FIG. 3B is an image of a thin film photovoltaic device where the semiconductor layer has a thicker backside metal contact providing mechanical support.

Referring back to FIG. 2, according to one embodiment, a reflective layer 203 may be positioned on the surface of the layer 205 of beta emitter material 204 between the beta emitter material 204 and the scintillator material 202. A reflective layer may improve light collection. Moreover, a reflective layer may circumvent a parasitic absorption of light on the radioisotope surface.

In preferred approaches, a thickness of the reflective layer 203 may be in a range of greater than about 1 nm to less than about 2 µm, preferably approximately 50 nm or less. A minimum thickness may be dependent in part on the wavelength of the light of the system and the composition of the reflective layer. For example, for visible light, a minimum thickness of 5 nanometers (nm) may be sufficient for a single reflective layer comprising metal, and alternatively, a minimum thickness of approximately 1 µm may be sufficient for a dielectric (non-metallic) reflective layer, e.g., $TiO_2$.

A known reflective material may be used for the reflective layer 203, preferably a reflective material that is radiation hard. In one approach, the reflective layer comprises aluminum. In one approach, the reflective layer includes unoxidized aluminum.

A device 220 may include a plurality of stacks 206 of scintillator/beta emitter/photovoltaic layers, where each stack is positioned in a series in a vertical direction. The photovoltaic portion 214 may include layers 210a, 210b of photovoltaic material 208 sandwiching the layer 205a of beta emitter material 204 and layer 207a of scintillator material 202 therebetween. In various embodiments, the layers as described herein may be configured and tuned depending on specific applications.

FIGS. 4A-4E depict products 400, 420, 440, 460, 480 in accordance with various embodiments. As an option, the present products 400, 420, 440, 460, 480 may be implemented using and/or in conjunction with features from any other embodiment listed herein, such as those described with reference to the other FIGS., especially FIG. 2. Of course, however, such products 400, 420, 440, 460, 480 and others presented herein may be used in various applications and/or in permutations which may or may not be specifically described in the illustrative embodiments listed herein. Further, the products 400, 420, 440, 460, 480 presented herein may be used in any desired environment.

Figure 4A:
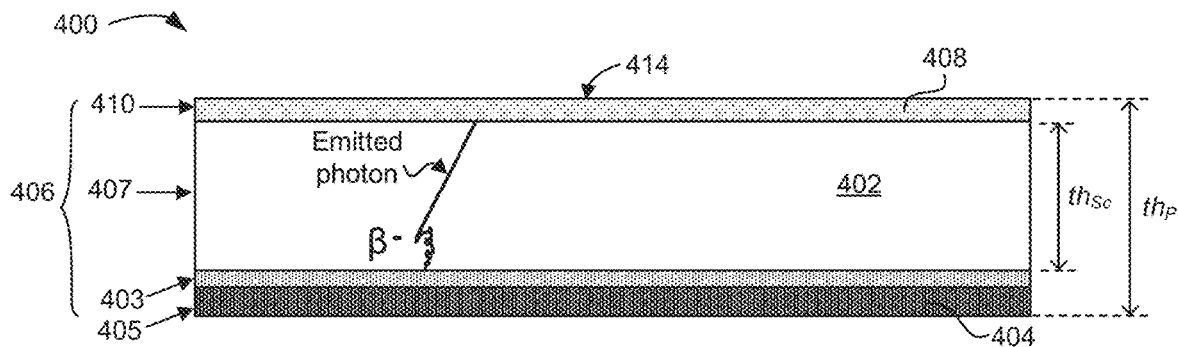
FIG. 4A is a schematic diagram of a product having a transparent scintillator material, beta emitter material, and a photovoltaic portion, according to one embodiment.

FIG. 4A depicts a schematic drawing of a side-view of a 2D product 400, according to one embodiment. A single stack 406 may have a layer 405 including a beta emitter material 404. In one approach, the beta emitter material may include a Tl metal. A reflective layer 403 may be positioned above the beta emitter material 404. The reflective layer 403 may include one or more of the following materials: aluminum, gold, etc. The product 400 preferably demonstrates minimal energy loss of the beta emission through the reflective layer.

A layer 407 of a transparent scintillator material 402 may be positioned above the reflective layer 403. A photovoltaic portion 414 includes a layer 410 of photovoltaic material 408. The photovoltaic portion 414 is positioned above the scintillator material 402. A beta emission $\beta^-$ from the layer 403 of beta emitter material 404 passes through the reflective layer 403 to the scintillator material 402. The transparent scintillator material 402 is configured to transform the beta emission $\beta^-$ from the beta emitter material 404 to an emitted photon (e.g., luminescence). The emitted photon is subsequently collected in the layer 410 having photovoltaic material 408 configured to convert light emitted by the scintillator material to electricity.

In one approach, the thickness $th_{Sc}$ of the layer 407 of scintillator material is sufficient to protect the photovoltaic portion 414 from more than negligible radiation damage from the layer 403 of beta emitter material 404. Negligible damage of the photovoltaic portion 414 is defined as degradation of electrical output by no greater than 10% over the service life of the product 400. In one approach, the thickness of the layer of scintillator material is sufficient to protect the photovoltaic portion from significant radiation damage. Significant radiation damage is defined as a more than 10% reduction in the electrical power output of the photovoltaic due to decreased open circuit voltage or short circuit current caused by defects generated in the photovoltaic cell by ionizing radiation.

In one approach, the layer 407 of scintillator material 402 may include sub-layers of scintillator material having the same or different compositions. Accordingly, the term "scintillator material" as used herein to describe material at various locations in the product is interpreted as allowing the use of the same or different compositions of scintillator materials at different locations of the product.

In one approach, the product 400 may include a transparent shielding layer between the layer 410 of photovoltaic material 408 and the layer 405 of beta emitter material 404. A thickness of the shielding layer may be sufficient to protect the photovoltaic portion 414 from more than negligible damage. The shielding layer may be formed of a scintillator material 402 that is the same or different composition as the scintillator material 402 adjacent the beta emitter material 404. In other approaches, the shielding layer may be formed of any known radiation shielding material.

In various embodiments, the structure of the scintillator material, beta emitter material, and photovoltaic portion may be scaled from a minimum size determined by the fundamental cell thickness to a larger size that may be only limited by the techniques for forming the structure. In one approach, as illustrated in FIG. 4A, a thickness $th_P$ of a product 400, comprised of scintillator material 402, beta emitter material 404, and a photovoltaic portion 414, may be in a range of approximately 150 µm to greater than 400 µm. Further, miniaturization of the structure may be limited by the thickness of scintillator included to shield radiation from the radioisotope to the photovoltaic. In an exemplary approach, a minimum thickness of the structure may be approximately 175 µm.

Figure 4B:
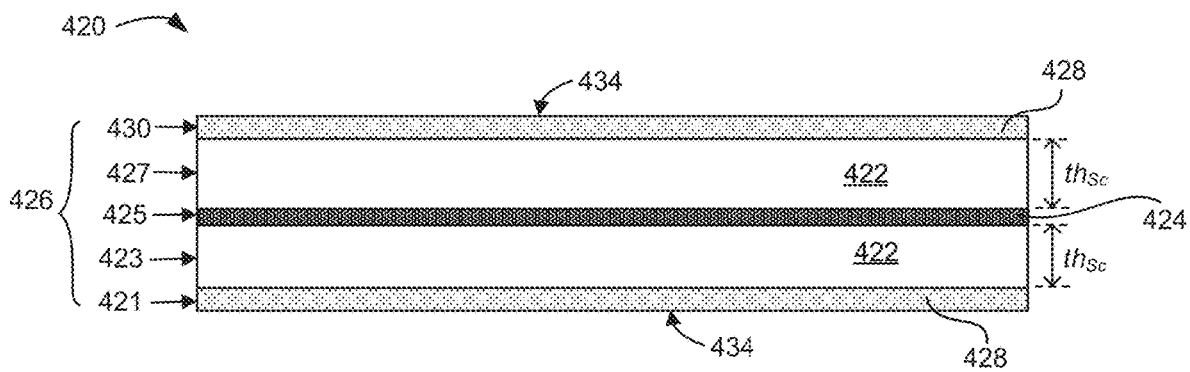
FIG. 4B is a schematic diagram of a product having beta emitter material intermixed with scintillator material, according to one embodiment.

According to one embodiment, at least some of the beta emitter material may be intermixed with the scintillator material. As shown in FIG. 4B, in one approach, a product 420 may have a layer 425 of beta emitter material 424 sandwiched between layers of the transparent scintillator material 422. The beta emitter material 424 may be as described elsewhere herein. In one approach the beta emitter material 424 is mixed with a transparent scintillator material in layer 425, as discussed in more detail below.

Layers of photovoltaic material 428 are positioned below and above the scintillator material 422 opposite the beta emitter material 424. The product 420 may include a single stack 426 of layers including layers 421, 430 comprising a photovoltaic material 428, layers 423, 427 comprising transparent scintillator material 422, and a layer 425 of beta emitter material 424 positioned between the layers 423, 427 of transparent scintillator material 422. In other approaches, the product 420 may include repeating structures of the stack 426 or portion thereof, one atop the other.

The photovoltaic portion may be configured as a single power producing unit. As shown in product 420 of FIG. 4B, the photovoltaic portion 434 may include two layers 421, 430 of photovoltaic material 428 sandwiching the beta emitter material 424 and scintillator material 422 therebetween. In one approach, the layers 430, 421 of photovoltaic material 428 may include layers and/or sub-layers of the same or different compositions of photovoltaic material. The various layers of photovoltaic material comprise the single power producing unit of the photovoltaic portion for producing electricity.

In one approach, the thickness $th_{Sc}$ of each layer 423, 427 of scintillator material 422 may be sufficient to protect the photovoltaic portion 434 from more than negligible radiation damage as described herein. The thickness $th_{Sc}$ of each layer 423, 427 may be different or the same.

In one approach, a layer 425 of beta emitter material 424 may be in intimate contact with the scintillator material 422. In another approach, one or more reflective layers are interposed between layer 425 and the scintillator material 422.

In one approach, the layer 425 may include beta emitter material 424 intermixed with a scintillator material. The scintillator material in both the mixture in layer 425 and layers 423, 427 may have the same or different compositions, in various approaches. Likewise, the scintillator material 422 in each layer 423, 427 may have the same or different compositions as one another. The layers including scintillator material may have sub-layers having different or the same compositions of scintillator material.

In some approaches, the beta emitter material and sections of scintillator material, e.g., the same or different compositions as the layers of scintillator material, may be present in alternating portions in the space between the layers of scintillator material. For example, a product 420 may have more than one series alternating layers of beta emitter material 424 and scintillator material 422 positioned between layers 423, 427 of scintillator material 422 adjacent the photovoltaic portion 434.

In one approach, the product 420 may include transparent shielding layers (not shown) between the layers 421, 430 of photovoltaic material 428 and the layer 425 of beta emitter material 424. A thickness of the shielding layer may be sufficient to protect the photovoltaic portion 434 from more than negligible damage. The shielding layer may be formed of a scintillator material 422 that is the same or different composition as the scintillator material 422 adjacent the beta emitter material 424. In other approaches, the shielding layer may be formed of any known transparent radiation shielding material.

Figure 4C:
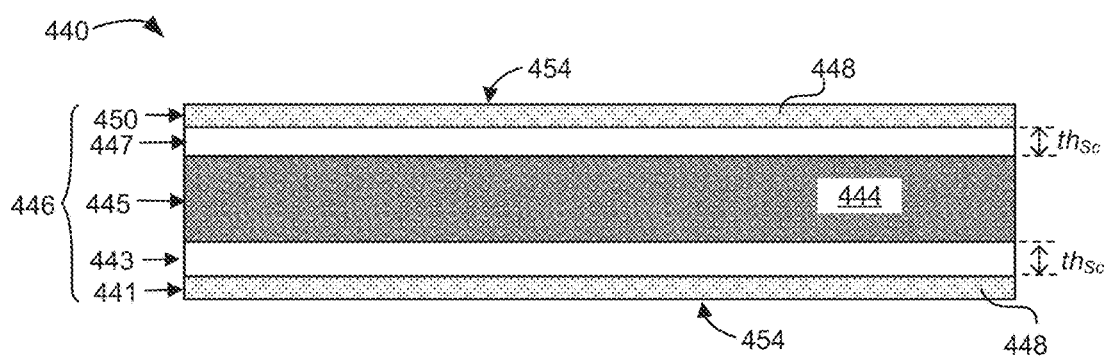
FIG. 4C is a schematic diagram of a product having a homogenous mixture of beta emitter material and scintillator material, according to one embodiment.

In one embodiment, a product may include at least some of the beta emitter material homogenously intermixed with the scintillator material throughout the bulk of the scintillator material. The source of beta emissions may be a homogeneously distributed source in a layer of scintillator material. As illustrated in FIG. 4C, a product 440 may include a photovoltaic portion 454 positioned adjacent transparent shielding layers 443, 447 of any type described herein opposite a layer 445 of homogenously intermixed material 444 of beta emitter material and scintillator material. For example, in a 2D product, the product 440 may include a single stack 446 of layers including layers 441, 450 comprising a photovoltaic material 448, shielding layers 443, 447 e.g., comprising transparent scintillator material or other shielding material, and a layer 445 of a homogenously intermixed material 444 of beta emitter material and scintillator material positioned between the shielding layers 443, 447.

As shown in product 440 of FIG. 4C, the photovoltaic portion 454 may include two layers 441, 450 of photovoltaic material 448 sandwiching the homogenously intermixed material 444 of beta emitter material and shielding layers 443, 447 therebetween. In one approach, the layers 441, 450 of photovoltaic material 448 may include layers and/or sub-layers of the same or different compositions of photovoltaic material. In one approach, the scintillator material of layer 445 may be present in the shielding layers 443, 447 between the layers 441, 450 of photovoltaic material 448 and the layer 445 of homogenously intermixed material 444 of beta emitter material and scintillator material.

In some approaches, a product may have one layer 450 of photovoltaic material 448 and one shielding layer 447 positioned above the layer 445 of homogenously intermixed material 444 of beta emitter material and scintillator material.

In one approach, the thickness $th_{Sc}$ of each shielding layer 443, 447 is sufficient to protect the photovoltaic portion 454 from more than negligible radiation damage as described herein. The thickness $th_{Sc}$ of each layer 443, 447 may be different or the same.

In one approach, a layer 445 of homogenously intermixed material 444 may include beta emitter material in intimate contact with the scintillator material.

In one approach, the layer 445 may include beta emitter material intermixed with scintillator material between shielding layers 443, 447 that comprise scintillator material. The scintillator material in both the mixture and shielding layers 443, 447 may have the same or different compositions, in various approaches. Likewise, the shielding material in each shielding layer 443, 447 may have the same or different compositions relative to one another. The various layers 443, 445, 447 may have sub-layers having different or the same compositions of scintillator material.

In some approaches, the layer 445 of homogenously intermixed material 444 of beta emitter material and scintillator material and shielding layers/sections may be present in alternating portions in the space between the layers of scintillator material. For example, a product 440 may have more than one series of alternating layers of a 445 of homogenously intermixed material 444 and layers of scintillator material in a space between shielding layers 443, 447 adjacent the photovoltaic portion 454.

Preferably, a thickness of each shielding layer 443, 447 is sufficient to protect the photovoltaic portion 454 from more than negligible damage as described herein. Again, each shielding layer 443, 447 may be formed of a scintillator material that is the same or different composition as the scintillator material in the homogenously intermixed material 444 of beta emitter material and scintillator material. In other approaches, the shielding layer may be formed of any known radiation shielding material.

In one embodiment, at least one of the layers of scintillator material has a nonplanar surface that defines pockets in which the beta emitter material may be deposited. For example, as illustrated in the schematic drawing of product 460 in FIG. 4D, a layer 463 of scintillator material 462 has a non-planar surface 472 that defines pockets 465 in which the beta emitter material 464 may be deposited. The product may be a three-dimensional (3D) structure such that the layer 463 of scintillator material 462 is characterized by features 476 such as pillars, ridges, channels, etc. In one approach, the scintillator material may form ridges such that the ridges form a cavity between adjacent ridges. The cavity between the ridges of scintillator material may be filled with beta emitter material. In preferred approaches, the surface area is maximized between the beta emitter material and the scintillator material.

In one approach, the beta emitter material 464 may be in contact with more than one non-planar surface 472 of the layer 463 of scintillator material 462. In one approach, the deposited beta emitter material 464 may fill greater than 25% of the pocket 465 defined by the non-planar surface 472 of the layer 463 of scintillator material 462. In another approach, the deposited beta emitter material 464 may fill the pocket 465 defined by the non-planar surface 472 of the layer 463 of scintillator material 462 in a range of about 25% to about 100%.

In one approach, the product 460 includes a second layer 467 of scintillator material 462 above the deposited beta emitter material 464. The photovoltaic portion 474 may include two layers 461, 470 of photovoltaic material 468 sandwiching the beta emitter material 464 and scintillator material 462 therebetween. In some approaches, a single stack 466 of layers includes one layer 470 of photovoltaic material 468 and one layer 467 of scintillator material 462 above the beta emitter material 464.

The thickness $th_{Sc}$ of each layer 463, 467 of scintillator material 462 may be sufficient to protect the photovoltaic portion 474 from more than negligible radiation damage as described herein. The thickness $th_{ScNP}$ of the scintillator material having a non-planar surface may be defined as the distance from the closest edge of the beta emitter material 464 to the closest edge of the photovoltaic portion 474. The thickness $th_{ScNP}$, $th_{Sc}$ of each layer 463, 467 may be different or the same.

Figure 4D:
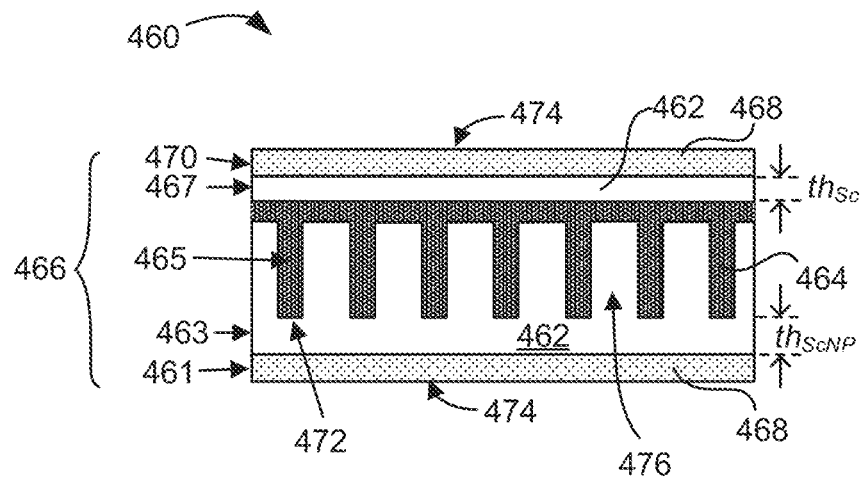
FIGS. 4D-4E each depict a schematic diagram of a product having a three-dimensional structure such that the scintillator material has a non-planar surface that defines a space for deposition of beta emitter material, according to various embodiments.

For some embodiments, the size of the scintillator and beta emitter material structure may be measured in terms of volume. For example, a size of the 3D structure of the product 460, as illustrated in FIG. 4D, may be in a range of greater than about 0.2 cm³ to a size limited by the thickness of the radiation shielding between the beta emitter material and photovoltaic portion. In one exemplary approach, the cumulative size of the scintillator, beta emitter material, and photovoltaic structure may be approximately 5 cm³ to 40 cm³ but may be larger.

In one approach, a layer of the beta emitter material may be in intimate contact with the scintillator material. As shown in a 3D product 460 in FIG. 4D, beta emitter material 464 deposited in the pockets 465 may be in intimate contact with the scintillator material 462.

In one approach, the beta emitter material 464 may be intermixed with scintillator material 462 between the layers 463, 467 of scintillator material 462. The scintillator material in both the mixture and layers may have the same or different compositions, in various approaches. Likewise, the scintillator material 462 in each layer 463, 467 may have the same or different compositions. The layers including scintillator material may have sub-layers having different or the same compositions of scintillator material.

In some approaches, the beta emitter material 464 and layers/sections of scintillator material 462, e.g., the same or different compositions as the layers of scintillator material, may be present in alternating portions in the space between the layers of scintillator material. For example, a product 460 may have more than one series of a 463 of scintillator material 462 having a non-planar surface 472 that defines pockets in which the beta emitter material 464 is deposited in a space between layers 463, 467 of scintillator material 462 adjacent the photovoltaic portion 474. For example, in a product having machined scintillator material and deposition of beta emitter material, a product having a width greater than 20 to 50 µm, the aspect ratio of the depth to width may be less than approximately 5-10.

As noted above, in some approaches, the thickness of the scintillator material 462 above and below the beta emitter material 464 is sufficient to protect the photovoltaic portion 474 from more than negligible damage as described herein. In one approach, the product 460 may include transparent shielding layers (not shown) between the layers 461, 470 of photovoltaic material 468 and the deposited beta emitter material 464 and scintillator material 462. A thickness of the shielding layer may be sufficient to protect the photovoltaic portion 474 from more than negligible damage as described herein. The shielding layer may be formed of a scintillator material 462 that is the same or different composition as the scintillator material 462 adjacent deposited beta emitter material 464. In other approaches, the shielding layer may be formed of any known radiation shielding material.

One or more reflective layers may be positioned between the beta emitter material 464 and the scintillator material 462.

Figure 4E:
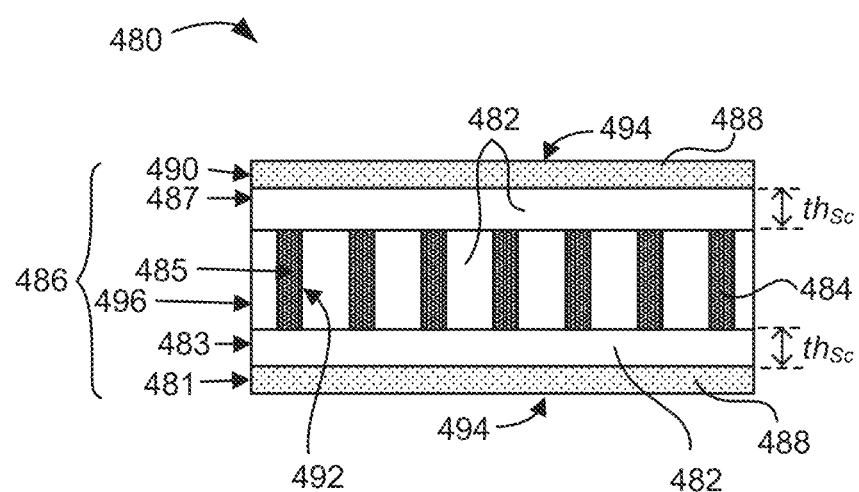

According to another embodiment, as shown illustrated in the schematic drawing of product 480 in FIG. 4E, a layer 496 of scintillator material 482 has a non-planar surface 492 that defines pockets 485 in which the beta emitter material 484 is deposited. The product may be a 3D structure such that the layer 496 of scintillator material 482 is characterized as a wall surrounding a pocket 485. The pocket 485 may be a cavity defined by non-planar surface 492 (e.g., walls) of the layer 496 and possibly the layers 483, 487 of the scintillator material 482.

In one approach, the beta emitter material and scintillator material may be arranged such that each layer of beta emitter is encapsulated by the scintillating material. In one approach, the beta emitter material 484 may be in contact with more than one non-planar surface 492 of the layer 496 of scintillator material 482 and/or the layers 483, 487 of scintillator material 482. Preferably, the deposited beta emitter material 484 fills greater than 25% of the pocket 485 defined by the non-planar surface 492 of the layer 496 of scintillator material 482. In another approach, the deposited beta emitter material 484 may fill the pocket 485 defined by the non-planar surface 492 of the layer 496 and layers 483, 487 of scintillator material 482 in a range of about 25% to about 100%.

In one approach, the product 480 includes a second layer 483, 487 of scintillator material 482 above and/or below the deposited beta emitter material 484. The photovoltaic portion 494 may include two layers 481, 490 of photovoltaic material 488 sandwiching the beta emitter material 484 and scintillator material 482 therebetween. In some approaches, a single stack 486 of layers includes one layer 490 of photovoltaic material 488 and one layer 487 of scintillator material 482 above the beta emitter material 484.

The thickness $th_{Sc}$ of each layer 483, 487 of scintillator material 482 may be sufficient to protect the photovoltaic portion 494 from more than negligible radiation damage as described herein. The thickness $th_{Sc}$ of each layer 483, 487 may be different or the same.

In one approach, a layer of the beta emitter material may be in intimate contact with the scintillator material. As shown in a 3D product 480 in FIG. 4E, beta emitter material 484 deposited in the pockets 485 may be in intimate contact with the scintillator material 482.

In one approach, the beta emitter material 484 may be intermixed with scintillator material 482 between the layers 496, 483, 487 of scintillator material 482. The scintillator material in both the mixture and layers may have the same or different compositions, in various approaches. Likewise, the scintillator material 482 in each layer 483, 487 may have the same or different compositions. The layers including scintillator material may have sub-layers having different or the same compositions of scintillator material.

In some approaches, the beta emitter material 484 and layers/sections of scintillator material 482, e.g., the same or different compositions as the layers of scintillator material, may be present in alternating portions in the space between the layers of scintillator material. For example, a product 480 may have more than one series of a 496 of scintillator material 482 having a non-planar surface 492 that defines pockets 485 in which the beta emitter material 484 is deposited in a space between layers 483, 487 of scintillator material 482 adjacent the photovoltaic portion 494. For example, in a product having machined scintillator material and deposition of beta emitter material, a product having a width greater than 20 to 50 µm, the aspect ratio of the depth to width may be less than approximately 5-10.

As noted above, in some approaches, the thickness of the scintillator material 462 above and below the beta emitter material 464 is sufficient to protect the photovoltaic portion 474 from more than negligible damage as described herein. In one approach, the product 480 may include transparent shielding layers (not shown) between the layers 481, 490 of photovoltaic material 488 and the deposited beta emitter material 484 and scintillator material 482. A thickness of the shielding layer may be sufficient to protect the photovoltaic portion 494 from more than negligible damage as described herein. The shielding layer may be formed of a scintillator material 482 that is the same or different composition as the scintillator material 482 adjacent deposited beta emitter material 484. In other approaches, the shielding layer may be formed of any known radiation shielding material.

One or more reflective layers may be positioned between the beta emitter material 484 and the scintillator material 482.

In early contemplated approaches of the present invention, configurations of the layers as described herein were found to provide less than optimal energy output. Several such approaches are described below with reference to FIGS. 5A-5C. Though these approaches were found to be less than optimal using current materials, they are inventive, nonetheless. None of the designs illustrated in FIGS. 5A-5C is drawn to scale.

An early design of a device 500 included a GYGAG scintillator material 502, radioisotope source 504 (e.g., Tl metal), reflective layers 506, and a photodiode 508, as shown in the schematic drawing of FIG. 5A. A beta emission β⁻ travels into the scintillator material 502 thereby being converted to an emitted photon that travels to the photodiode 508. However, this device 500 has notable drawbacks. In particular, light extraction can be challenging. Materials for the reflective layer 506, e.g., aluminum (Al), silver (Ag) and gold (Au), are not reflective enough for very high aspect ratio scintillation parts, for example having an aspect ratio of 0.02×6×8. Self-absorption, evanescent wave property losses, etc. reduce percentage of light collected at the photovoltaic. White diffuse reflector layers (e.g., reflectors) are preferred (greater than 99% reflection) but typically have a thickness that is larger than desired. The cumulative thickness of a reflective layer results in a dramatically decreased power density. In some approaches, a thickness of the reflective layer on the order of 1-5 µm may be necessary for the full effect to be realized. A preferred thickness of the scintillator material is preferably at least 100 µm. Moreover, minimizing chord length (total path) of light in scintillator material may likely improve collected efficiency.

In one approach, a stacked diode design, as illustrated in the schematic drawings of FIGS. 5B and 5C, may improve light extraction but may increase radiation dose to diodes. FIG. 5B illustrates a stacked version 520 of a device having a stacked diode 526 in which layers of GYGAG scintillator 522 sandwich layers of radioisotope 524, e.g., thallium (Tl) metal, therebetween. Additionally, a border layer 530 of GYGAG scintillator is vertically aligned along the horizontal diode stack 526 of GYGAG/Tl layers, and a photovoltaic portion 528 is aligned on the opposite side of the GYGAG border layer 530 from the diode stack 526 of GYGAG/Tl layers. An advantage of the stacked version 520 includes low x-ray and beta emission dose to the photovoltaic, the GYGAG border provides protection of the photovoltaic. However, a drawback of this approach includes poor light extraction and thus lower than expected efficiency.

According to another approach, FIG. 5C illustrates a second stacked version 540 of a device including multiple sets of a GYGAG scintillator/Tl layer stack 546 comprised of two GYGAG scintillator layers 542 with a radioisotope layer 544, e.g., a Tl metal layer, positioned therebetween. The second stacked version 540 includes a photovoltaic layer 548 positioned above and below each set of GYGAG scintillator/Tl layer stack 546. An advantage of the second stacked version 540 is improved light collection from scintillation that in turn may boost efficiency of power generation. A drawback of the second stacked version 540 is an increased x-ray and beta emission dose to the photovoltaic layers 548.

FIG. 6 depicts a flowchart of a method 600 for forming a product, in accordance with one embodiment. As an option, the present method 600 may be implemented to form materials such as those shown in the other FIGS. described herein. Of course, however, this method 600 and others presented herein may be used provide applications which may or may not be related to the illustrative embodiments listed herein. Further, the methods presented herein may be carried out in any desired environment. Moreover, more, or less operations than those shown in FIG. 6 may be included in method 600, according to various embodiments. It should also be noted that any of the aforementioned features may be used in any of the embodiments described in accordance with the various methods.

According to one embodiment, a method 600 includes an operation 602 of forming a product that includes a transparent scintillator material, a beta emitter material having an energy of greater than 225 keV, and a photovoltaic portion configured to convert light by the scintillator material to electricity. The method 600 may be used to form any approach described herein, including those described with reference to FIGS. 2-5C.

In one approach, a product includes multiple layers of beta emitter material (e.g., radioisotope) coupled to a scintillating material made of an optically transparent polycrystalline ceramic garnet-structure scintillator coupled to one or more photovoltaic portions. The scintillating material may be fabricated using conventional techniques that would become apparent to one skilled in the art upon reading the present disclosure. For example, the scintillator material may be formed by pressing powdered ceramic nanoparticles, microparticles, etc. doped with an activator, e.g., cerium, to form a green body. The formed green body may be sintered in a controlled atmosphere to approximately 90% theoretical density. The sintered green body may be isostatically pressed under high pressure to form an optically transparent ceramic at approximately full density (100%). The transparent ceramic may then be annealed at high temperature to control the optical properties.

During the fabrication of the scintillator, a beta emitter material (e.g., radioisotope) may be placed in physical contact with the scintillator. In one approach, the geometry of the radioisotope may be in the form of micron-scale particles mixed in the scintillator during pressing of the ceramic powder to form a homogenous source. In another approach, the geometry of the beta emitter material may be as a two-dimensional (2D) semiconductor structure (see FIGS. 4A-4C). In yet another approach, the geometry of the beta emitter material may be filled in a three-dimensional (3D) semiconductor structure (see FIGS. 4D-4E). The coupled beta emitter material and scintillator system may be surrounded by a thin (e.g., approximately 3 mm, in one approach) layer of transparent ceramic scintillator without any radioisotope in the scintillator material.

In one approach, the beta emitter material may include a mixture of different beta emitter materials, e.g., Sr-90 and Tl-204. In some approaches, the different beta emitter materials may be combined in the apparatus. For example, a mixture of two or more beta emitter materials may be mixed prior to addition of the mixture as a layer of beta emitter material in the device. In another approach, the device may include multiple single compositions of beta emitter material, e.g., a first layer is a first composition of beta emitter material, a second layer positioned above the first layer is a second composition of beta emitter material that is different from the first, a third layer is the first composition of beta emitter material, etc. Any combination of beta emitter material(s) may be included in the device and mixed prior to addition or mixed in the device. These are examples only and are not meant to be limiting in any way.

According to one embodiment, the scintillation layer (e.g., outer scintillation material layer) may serve to attenuate beta particles and reduce the flux of damaging x-rays that may otherwise irradiate the photovoltaics on the surfaces of the scintillator structures. In various approaches, it is preferable for candidates for scintillators suitable to convert the radioisotope decay energy to photons to have effective radiation resistance. For example, and not meant to be limiting, some preferred scintillators may demonstrate a radiation resistance to greater than 500 Mrad of electron irradiation.

In one approach, inorganic oxide scintillators having a luminosity greater than 30,000 photons/MeV, either single crystal or polycrystalline ceramic, may be activated with rare earth elements. In various approaches, rare earth elements include GYGAG(Ce), YAG:Ce, LuSiO:Ce, LuYAlG:Pr, etc. in varying ratios of their constituents. These are by way of example only and are not meant to be limiting in any way.

The bandgap of the photovoltaic cells and the energy of the photons emitted by the scintillator are preferably well matched. Possible photovoltaic cell materials include InGaP, SiC, GaN, amorphous Si, diamond, AlN, GaAs, c-Si, AlGaN, AlGaP, hexagonal BN, CdTe, CIGS, inorganic perovskite materials, etc.

In one approach, on each face of the layer of beta emitter material (e.g., radioisotope source) a thin (~50 nm) unoxidized aluminum coating may be applied to provide reflection of photons incident on the radioisotope layer to increase the light collection efficiency of the device.

In various approaches, the product may be formed by creating laminated layers using techniques as would become apparent to one skilled in the art reading the present disclosure. For example, a layer of photovoltaic material may be fabricated in one process, and then the subsequent layers of scintillator material, beta emitter material, scintillator material, and a second layer of photovoltaic material are serially laminated above each other, e.g., as in a tape roll process.

Experiments

GYGAG(Ce) Scintillator Material

Figure 7A:
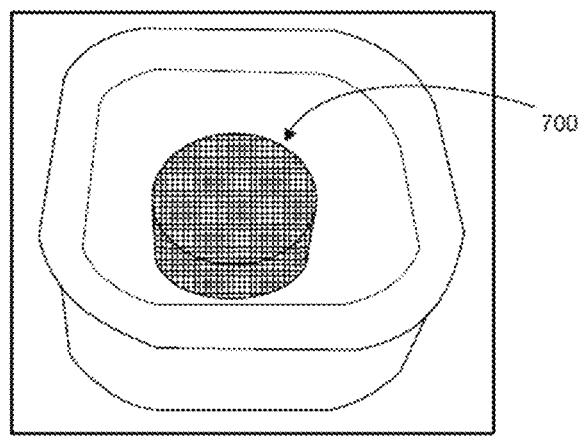
FIG. 7A is an image of a GYGAG(Ce) transparent ceramic scintillator.
Figure 7B:
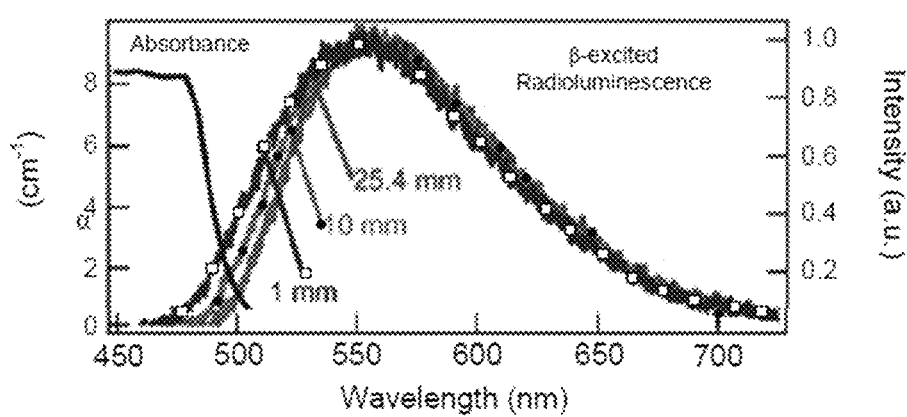
FIG. 7B is a plot of absorption and emission spectra of samples of beta-irradiated GYGAG(Ce) scintillator material.

As shown in the image of FIG. 7A, a GYGAG(Ce) scintillator 700 is a transparent ceramic scintillator having a diameter of 16 mm.

Irradiation of GYGAG(Ce) Scintillator Material

FIG. 7B is a plot of β-irradiated GYGAG(Ce) emission and absorption spectra of samples having varying thicknesses, 1 mm (□), 10 mm (●), and 25.4 mm. The light yield of GYGAG(Ce) tends to be in a range of 20 to 25 eV/photon. For an emission photon exhibiting about 2.2 eV, the incident radiation-to-photon conversion efficiency of a GYGAG(Ce) material may be in a range of about 8 to 11% as shown in the spectral range of 450 nm to 700 nm.

FIG. 8A shows the radiation-hardness of a GYGAG(Ce) scintillator in response to beta irradiation. The scintillation efficiency was measured on each side of the scintillator (Side 1 and Side 2), to show the light yield of a transparent scintillator before and after a high dose of beta irradiation, 550 Mrad dose of 1 MeV electrons for 4 hours. The 550 Mrad dose is approximately equivalent to about 5% of a 10-year dose and thus may represent longevity of scintillator. There is no difference in the scintillation efficiency between the Side 1 and Side 2 of the irradiated scintillator sample (within experimental error), nor any difference in the scintillation efficiency before and after irradiation (all curves have the same pattern).

Electron irradiations were also performed using electrons ranging in energy from 500 keV to 2 MeV. The samples were held below 200° C. and irradiated to doses from 3 to 310 Grad. Within experimental error of 5-10% there was no difference in scintillation efficiency or light yield between the irradiated and unirradiated scintillator samples. This was verified using alpha, beta, and gamma radioluminescence of each of the irradiated samples on both the irradiated and unirradiated surfaces and compared to the pre-irradiated results.

Alpha particle irradiation of a GYGAG(Ce) scintillator has a different effect on Side 1 and Side 2 of an irradiated scintillator sample. FIG. 8B shows the effect of alpha particle irradiation of a GYGAG(Ce) scintillator with an energy of 0.5 to 3.5 MeV (compared to the 1 MeV of beta irradiation of FIG. 8A in which the fluence of about $10^{16}/cm^2$ is the same as for the beta irradiation test). Looking to the emission maxima, Side 1 (solid line) receiving the irradiation of alpha particles demonstrates an emission of just below approximately 1.6e5 whereas Side 2 (Q, the non-irradiated side) demonstrates a notable 98% degradation of light yield, at approximately 3.6e3. For both irradiation tests (beta emission irradiation, FIG. 8A, and alpha particle irradiation, FIG. 8B) the transmission and absorption demonstrate less % error. Side 1 irradiated with alpha particles produces 2.3% of the emission of the non-irradiated side.

Uses

Various embodiments described herein may be used as and/or for use with a radioisotope battery, sensors, electronics, light sources, radiation hard electronics, nuclear fuel monitoring, spacecraft, and remote electronics.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments but should be defined only in accordance with the following claims and their equivalents.

What is claimed is:

1. A product, comprising:
   a transparent scintillator material;
   a beta emitter material; and
   a photovoltaic portion configured to convert light emitted by the scintillator material to electricity,
   wherein the scintillator material is characterized as not exhibiting greater than 10% degradation of light output under continuous exposure to radiation energy at 1 megaelectron volt (MeV) to a dose of at least 1 gigarad for a duration of one year.

2. The product as recited in claim 1, wherein the scintillator material is in the form of a ceramic.

3. The product as recited in claim 1, wherein the scintillator material is in the form of a single crystal material.

4. The product as recited in claim 1, wherein the scintillator material exhibits a light output of greater than about 30,000 photons per megaelectron volt (MeV).

5. The product as recited in claim 1, wherein at least some of the scintillator material includes an activator.

6. The product as recited in claim 1, wherein the beta emitter material has an average radiation energy of less than about 1 MeV.

7. The product as recited in claim 1, wherein at least some of the beta emitter material is intermixed with the scintillator material.

8. The product as recited in claim 7, wherein the at least some of the beta emitter material is homogeneously intermixed with the scintillator material.

9. The product as recited in claim 1, wherein a layer of the beta emitter material is in intimate contact with the scintillator material.

10. The product as recited in claim 1, comprising a reflective layer positioned between the beta emitter material and the scintillator material.

11. The product as recited in claim 1, wherein a thickness of the photovoltaic portion is in a range of about 1 micron to about 500 microns.

12. The product as recited in claim 1, wherein the photovoltaic portion includes two layers of photovoltaic material sandwiching the beta emitter material and scintillator material therebetween.

13. The product as recited in claim 12, wherein the scintillator material is present in two layers, each layer of the scintillator material being positioned between a respective one of the layers of the photovoltaic material and the beta emitter material.

14. The product as recited in claim 13, wherein the beta emitter material, that is positioned between the layers of the scintillator material, is intermixed with a second scintillator material.

15. The product as recited in claim 13, wherein at least one of the layers of the scintillator material has a nonplanar surface.

16. The product as recited in claim 13, wherein a space is present between the layers of the scintillation material, the beta emitter material and sections of a second scintillator material being present in alternating portions in the space.

17. The product as recited in claim 12, comprising transparent shielding layers between the layers of the photovoltaic material and the beta emitter material, wherein a thickness of each shielding layer is sufficient to protect the photovoltaic portion from more than negligible radiation damage.

18. A product, comprising:
    a transparent scintillator material, wherein the scintillator material is present in two layers;
    a beta emitter material having an end-point energy of greater than 225 kiloelectron volts (keV); and
    a photovoltaic portion configured to convert light emitted by the scintillator material to electricity,
    wherein the layers of the scintillator material are positioned between the beta emitter material and the photovoltaic portion,
    wherein the beta emitter material and sections of a second scintillator material are present in alternating portions in the space between the layers of the scintillator material.

19. A product, comprising:
    a transparent scintillator material, wherein the scintillator material is present in two layers, wherein at least one of the layers of the scintillator material has a nonplanar surface;
    a beta emitter material; and
    a photovoltaic portion configured to convert light emitted by the scintillator material to electricity.

20. The product as recited in claim 19, further comprising transparent shielding layers between the photovoltaic portion and the beta emitter material, wherein a thickness of each shielding layer is sufficient to protect the photovoltaic portion from more than negligible radiation damage.

* * * * *